United States Patent
Zhou et al.

(10) Patent No.: US 9,552,880 B2
(45) Date of Patent: Jan. 24, 2017

(54) SCREENING FOR LATER LIFE STUCK BITS IN FERROELECTRIC MEMORIES

(71) Applicant: Texas Instruments Incorporated, Dallas, TX (US)

(72) Inventors: Carl Z. Zhou, Plano, TX (US); John A. Rodriguez, Dallas, TX (US); Richard A. Bailey, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/019,698

(22) Filed: Feb. 9, 2016

(65) Prior Publication Data

US 2016/0240253 A1     Aug. 18, 2016

Related U.S. Application Data

(60) Provisional application No. 62/116,660, filed on Feb. 16, 2015.

(51) Int. Cl.
*G11C 11/22*     (2006.01)
*G11C 14/00*     (2006.01)

(52) U.S. Cl.
CPC ......... *G11C 14/0072* (2013.01); *G11C 11/221* (2013.01); *G11C 11/2273* (2013.01)

(58) Field of Classification Search
USPC ........................................................ 365/145
See application file for complete search history.

(56) References Cited

U.S. PATENT DOCUMENTS

| 5,844,832 | A * | 12/1998 | Kim ........................ G11C 11/22 365/145 |
| 7,149,137 | B2 | 12/2006 | Rodriguez et al. |
| 7,813,193 | B2 | 10/2010 | Rodriguez et al. |
| 2015/0016175 | A1* | 1/2015 | Evans, Jr. ............. G11C 11/221 365/145 |
| 2015/0357050 | A1* | 12/2015 | Bailey .............. G11C 29/50016 365/145 |

OTHER PUBLICATIONS

U.S. Appl. No. 14/857,873, filed Sep. 18, 2015.

* cited by examiner

*Primary Examiner* — Hoai V Ho
*Assistant Examiner* — Minh Dinh
(74) *Attorney, Agent, or Firm* — Kenneth Liu; Charles A. Brill; Frank D. Cimino (57) ABSTRACT

A reliability screen of integrated circuits including ferroelectric random access memory (FRAM) arrays for stuck bits. The FRAM devices are subjected to a high temperature bake in wafer form. A "shmoo" of the reference voltage is performed, at an elevated temperature, for each device to identify a first reference voltage at which a first cell in the device fails a read of its low polarization capacitance data state, and a second reference voltage at which a selected number of cells in the device fail the read. The slope of the line between the first and second reference voltages, in the cumulative fail bit count versus reference voltage plane, is compared with a slope limit to determine whether any stuck bits are present in the device.

20 Claims, 6 Drawing Sheets

SCREENING FOR LATER LIFE STUCK BITS IN FERROELECTRIC MEMORIES

CROSS-REFERENCE TO RELATED APPLICATIONS

This application claims priority, under 35 U.S.C. §119(e), of Provisional Application No. 62/116,660, filed Feb. 16, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit electrical testing. Embodiments of this invention are more specifically directed to the screening of ferroelectric memory cells that are potentially of weak long term reliability.

Conventional metal-oxide-semiconductor (MOS) and complementary MOS (CMOS) logic and memory devices are prevalent in modern electronic systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

Ferroelectric technology is now utilized in non-volatile solid-state read/write random access memory (RAM) devices. These memory devices, commonly referred to as "ferroelectric RAM", or "FeRAM", or "FRAM" devices, are now commonplace in many electronic systems, particularly portable electronic devices and systems. FRAMs are especially attractive in implantable medical devices, such as pacemakers, defibrillators, and monitoring devices, due to the ultra-low power consumption of FRAM memory. Various memory cell architectures including ferroelectric capacitors are known in the art, including the well-known 2T-2C (two transistor, two capacitor) cells in which the two ferroelectric capacitors in a cell are polarized to complementary states. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors. Ferroelectric cells constructed in a 1T-1C (one transistor, one capacitor) arrangement, similar to conventional dynamic RAM memory cells, are attractive because of their small chip area, but at a cost of less robust read performance than the larger area 2T-2C and 6T cell types.

Figure 1A:
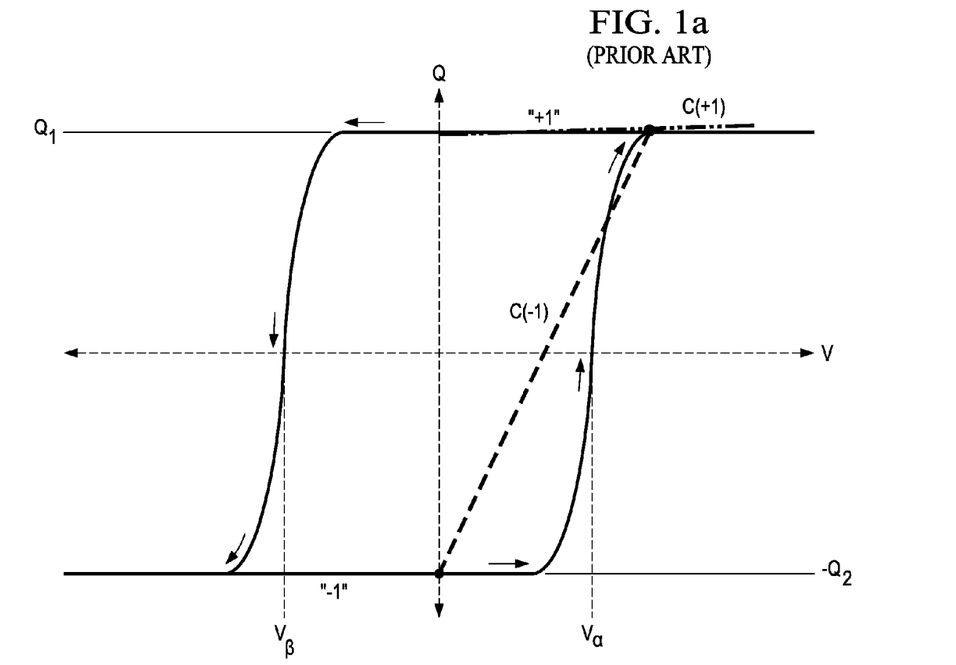
FIG. 1a is a plot of a charge-vs.-voltage characteristic of a conventional ferroelectric capacitor.

FIG. 1a illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance exhibited by a ferroelectric capacitor between its polarized states. As fundamental in the art, the capacitance of an element refers to the ratio of stored charge to applied voltage. While the ferroelectric capacitor has a linear capacitance, by virtue of its construction as parallel plates separated by a dielectric film (i.e., the ferroelectric material), it also exhibits significant polarization capacitance (i.e., charge storage) in response to changes in polarization state that occurs upon application of a polarizing voltage. For example, referring to FIG. 1a, the polarization of a ferroelectric capacitor from its "−1" state to its "+1" state is reflected in a relatively high capacitance C(−1), reflecting the storage of polarization charge in the capacitor in response to the change of polarization state by the voltage exceeding coercive voltage $V_\alpha$. On the other hand, a capacitor that already in its "+1" state exhibits little capacitance C(+1) due to polarization, since its ferroelectric domains are already aligned in the direction of the applied coercive voltage, causing little additional polarization charge to be stored. As will be evident from the following description, a stored logic state is read by interrogating the capacitance of the ferroelectric capacitors to discern its polarization state.

Figure 1B:
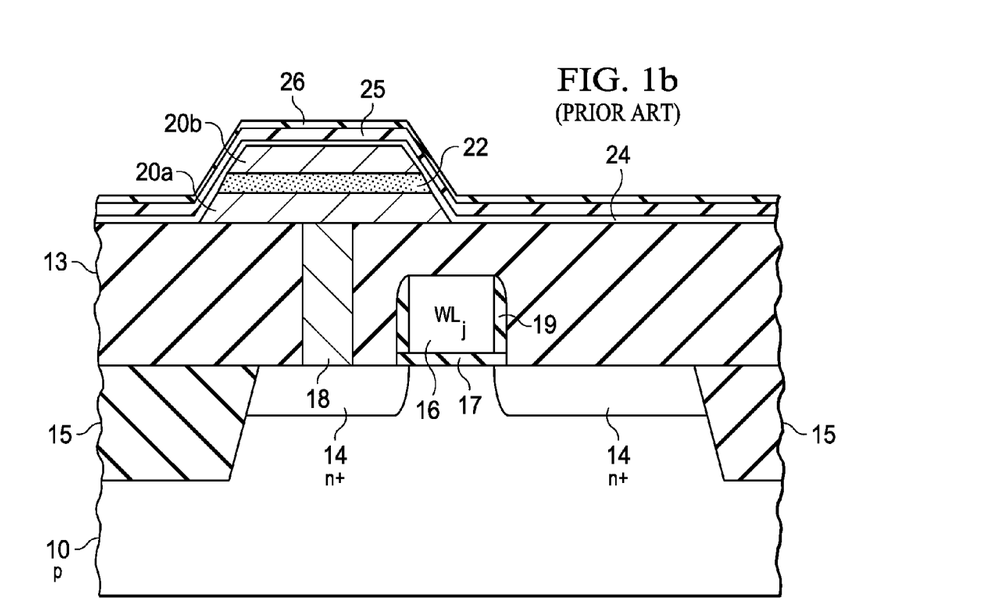
FIG. 1b is a cross-sectional view illustrating a portion of an integrated circuit including a ferroelectric capacitor constructed according to conventional methods.

FIG. 1b illustrates, in cross-section, a typical construction of a portion of an integrated circuit including a ferroelectric capacitor and an n-channel metal-oxide-semiconductor (MOS) transistor. In this arrangement, a MOS transistor is realized at the surface of p-type substrate 10 (or well), at an active region disposed between isolation dielectric structures 15 formed by shallow trench isolation in this example. N+ source/drain regions 14 are formed into substrate 10 on opposing sides of polysilicon gate element 16 in a self-aligned manner. Gate element 16 is separated from the surface of the active region by gate dielectric 17, thus forming the transistor. Sidewall spacers 19 on the sides of gate element 16 are useful in forming source/drain region extensions, as known in the art. A ferroelectric capacitor is formed in this structure by a ferroelectric stack including conductive plates 20a, 20b (formed of an elemental metal, or a conductive metal compound such as a metal nitride, conductive metal oxide, or a silicide, or a stack of two or more of these layers) between which ferroelectric material 22 is disposed. In this example, ferroelectric material 22 consists of PZT. Bottom conductive plate 20a is connected to the source/drain region 14 by conductive plug 18 formed into a contact opening etched through dielectric film 13. As typical in conventional process flows, passivation films 24, 25, 26 (e.g., of aluminum oxide, silicon nitride formed by high-density plasma, and CVD silicon nitride, respectively) are deposited over the ferroelectric capacitor structure to minimize hydrogen contamination of ferroelectric material 22.

Figures 2A, 2B:
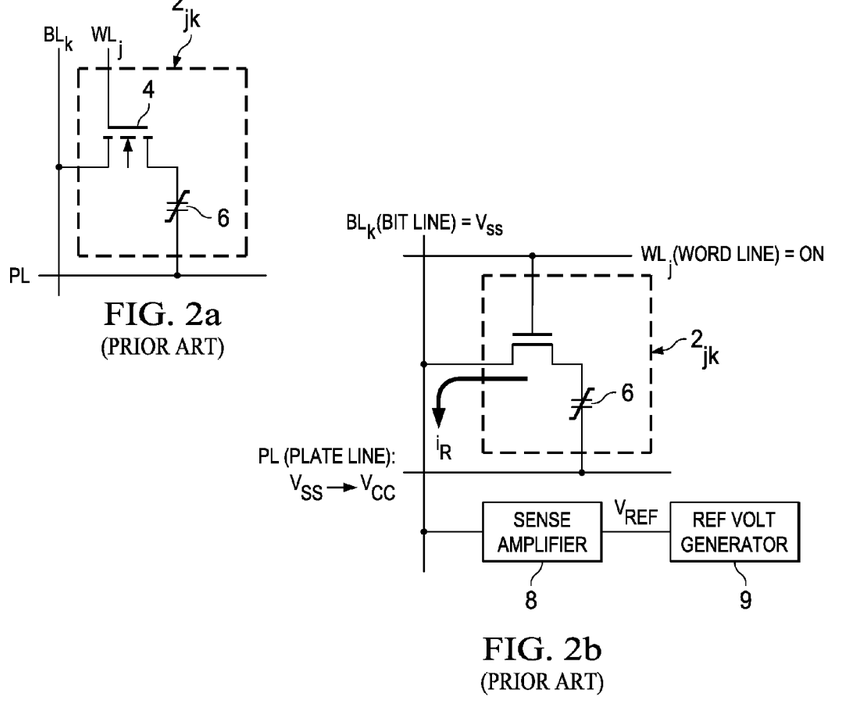
FIGS. 2a and 2b are electrical diagrams, in schematic and block form, illustrating a conventional 1T-1C ferroelectric memory cell and its operation.

FIG. 2a illustrates a typical arrangement of a conventional 1T-1C FRAM cell $2_{jk}$, which represents a single memory cell residing in a row j and a column k of an array of similar cells 2. Cell $2_{jk}$ includes n-channel pass transistor 4 and ferroelectric capacitor 6. The source/drain path of transistor 4 is connected between bit line $BL_k$ for column k of the array, and the top plate of ferroelectric capacitor 6; the gate of transistor 4 is controlled by word line $WL_j$ for row j of the array. The bottom plate of ferroelectric capacitor 6 is connected to plate line PL, which may be in common for all cells 2 in the array (or in a particular portion of the array, depending on the architecture). Those skilled in the art will recognize that 1T-1C FRAM cells are constructed similarly as conventional dynamic RAM memory cells.

FIG. 2b illustrates the arrangement of cell $2_{jk}$ of FIG. 2a within an FRAM device, particularly in the read context. In this example, sense amplifier 8 is coupled to bit line $BL_k$, and operates to compare the bit line voltage developed by read current $i_R$ to a reference voltage $V_{REF}$ generated by reference voltage generator circuit 9. As typical in the art for 1T-1C memory cells, the polarization state that exhibits the higher capacitance when sensed, which in this case is the "−1" polarization state, will be considered as the "1" data state, and the lower capacitance "+1" polarization state will be considered as the "0" data state. Cell $2_{jk}$ is written by applying voltages to plate line PL and bit line $BL_k$ that, with word line $WL_j$ energized, polarizes capacitor 6 into the desired polarization state. In this example, a "0" data state corresponding to the "+1" polarization state of FIG. 1 is written by the application of a low voltage ($V_{ss}$) to bit line $BL_k$, turning on word line $WL_j$, and then raising plate line PL to a high voltage ($V_{cc}$). Conversely, a "1" data state corresponding to the "−1" polarization state is written by the application of a low voltage ($V_{ss}$) to plate line PL, turning on word line $WL_j$, and then raising bit line $BL_k$ to a high voltage ($V_{cc}$).

Figure 2C:
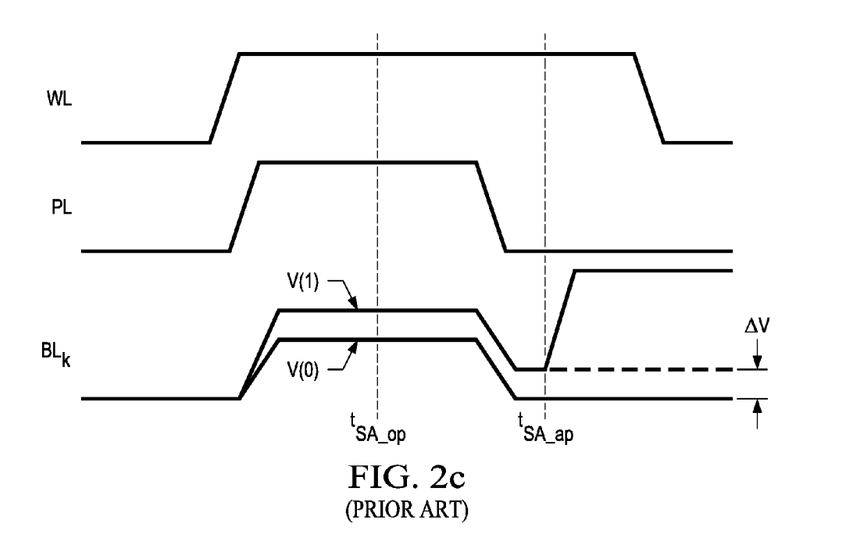
FIG. 2c is a timing diagram illustrating the operation of a read of the 1T-1C ferroelectric memory cell of FIGS. 2a and 2b.

The read operation of cell $2_{jk}$ begins with the precharging of bit line $BL_k$ to a low voltage (e.g., $V_{ss}$). As shown in FIG. 2c, once bit line $BL_k$ is precharged, word line $WL_j$ is energized to turn on transistor 4 and couple capacitor 6 to bit line $BL_k$. The voltage of plate line PL from the low voltage $V_{ss}$ is then raised to the high voltage $V_{cc}$ to interrogate the polarization capacitance of capacitor 6, according to the hysteresis diagram of FIG. 1. Specifically, the energizing of plate line PL induces a read current $i_R$ onto bit line $BL_k$ to develop a voltage on bit line $BL_k$. As known in the art, the voltage level developed on bit line $BL_k$ depends on the capacitance exhibited by ferroelectric capacitor 6 in cell $2_{jk}$ relative to the bit line capacitance. If capacitor 6 is in the "+1" polarization state, the read current $i_R$ will be relatively low and will thus develop a relatively low level bit line voltage V(0) as shown in FIG. 2c. Conversely, the "−1" polarization state of capacitor 6 will result in a relatively strong read current $i_R$, and a higher level voltage V(1) at bit line $BL_k$.

According to an "after-pulse sensing" approach as shown in FIG. 2c, sense amplifier 8 is activated at time $t_{SA\_ap}$, after the plate line PL pulse, at which time sense amplifier 8 compares the bit line voltage with the reference voltage $V_{REF}$ from reference voltage generator 9. To discern the stored data state, reference voltage $V_{REF}$ is set to a voltage between the expected low and high data state levels V(0), V(1), respectively (i.e., within the window ΔV of FIG. 2b). Following time $t_{SA\_ap}$, sense amplifier 8 drives bit line $BL_k$ to a full logic "1" level in response to detecting the higher bit line voltage V(1), and to a full logic "0" level in response to detecting the lower bit line voltage V(0), as shown in FIG. 2c. Another sensing approach, referred to as "on-pulse" sensing may alternatively be used; in this approach, sense amplifier 8 is activated during the plate line pulse, for example at time $t_{SA\_op}$ as shown in FIG. 2c.

By way of further background, copending and commonly assigned U.S. Patent Application Publication US 2015/0357050, incorporated herein by reference, describes a data retention reliability screen of FRAM cells in which a reference voltage level for the read of a high polarization capacitance data state (e.g., a "1" state) is determined for each integrated circuit being tested. A number of FRAM cells in the integrated circuit are programmed to the "1" data state, and then read at an elevated temperature. The number of failing cells is compared against a pass/fail threshold to determine whether that integrated circuit is vulnerable to long-term data retention failure.

By way of further background, copending and commonly assigned U.S. application Ser. No. 14/857,873, filed Sep. 18, 2015 and incorporated herein by reference, describes a data retention reliability screen of integrated circuits including ferroelectric random access memory (FRAM), in which sampled groups of the memory cells are tested at various reference voltage levels, after programming to a high polarization capacitance data state and a relaxation time at an elevated temperature. Fail bit counts of the sample groups at the various reference voltage levels are used to derive a test reference voltage, against which all of the FRAM cells in the integrated circuit are then tested after preconditioning (i.e., programming) and another relaxation interval at the elevated temperature, to determine those cells in the integrated circuit that are vulnerable to long-term data retention failure.

Another type of cell failure referred to as a "stuck bit" has been observed in modern 1T-1C ferroelectric memory cells. In the arrangement of cell $2_{jk}$ described above relative to FIGS. 2a and 2b, these stuck bit failures are exhibited by cells that return a "1" data state regardless of their programmed state. Stated another way, a stuck cell is exhibited by an instance of cell $2_{jk}$ programmed to a "0" data state (the "+1" polarization state of FIG. 1a), but that returns a "1" data state when read, as though it were programmed to the "−1" polarization state. It is believed that an instance of cell $2_{jk}$ that is "stuck" in this manner has a defect in its capacitor 6 causing it to leak charge from the pulse applied to its plate line PL through pass transistor 4, increasing the signal at its bit line $BL_k$ and appearing as a "1" data state. These stuck bits cannot be programmed to a "0" data state that is sufficiently strong to return the "0" data state when read, for reasonable levels of reference voltage $V_{REF}$. This failure mechanism of the stuck, or leaky, bit has been observed to develop over the operating life of the FRAM, for example as may be accelerated by a high temperature bake as commonly used to evaluate the reliability of a population of FRAM devices.

As known in the art, the sensing of 2T-2C cells in normal operation is based on a differential signal at complementary bit lines that are coupled to the accessed FRAM cell. By way of further background, a time-zero measurement of the slope of a cumulative fail bit distribution of half-cells in the 2T-2C memory, versus the reference voltage $V_{REF}$ is known in the testing of 2T-2C FRAM cells is used as a measure of time-zero polarization.

BRIEF SUMMARY OF THE INVENTION

Disclosed embodiments provide a method of performing a time-zero screen of ferroelectric random access memory (FRAM) cells to identify those that are vulnerable to becoming "stuck" at one polarization state during operating life.

Disclosed embodiments provide such a method that minimizes false positives and thus does not unduly affect test yield.

Disclosed embodiments provide such a method that can be efficiently performed using conventional automated test equipment.

Other objects and advantages of the disclosed embodiments will be apparent to those of ordinary skill in the art having reference to the following specification together with its drawings.

According to certain embodiments, a method of testing integrated circuits that include 1T-1C ferroelectric random access memory (FRAM) cells for later life failures is implemented by programming a plurality of its FRAM cells to a first data state (e.g., a "0" data state), and then subjecting the integrated circuits to a high temperature bake for a selected duration. Each integrated circuit is then electrically tested at an elevated temperature at varying reference voltages, to determine a slope of the fail bit distribution for a lower polarization capacitance state versus a reference voltage level at which the data state is sensed. The slope is compared against a pre-determined slope limit to determine whether stuck bits are exhibited.

DETAILED DESCRIPTION OF THE INVENTION

The one or more embodiments described in this specification are implemented into a ferroelectric memory in an integrated circuit, as it is contemplated that such implementation is particularly advantageous in that context. However, it is also contemplated that concepts of this invention may be beneficially applied to in other applications, for example ferroelectric elements utilized in other functions, such as programmable configuration bits or registers for various circuits, including analog circuits Accordingly, it is to be understood that the following description is provided by way of example only, and is not intended to limit the true scope of this invention as claimed.

Figure 3A:
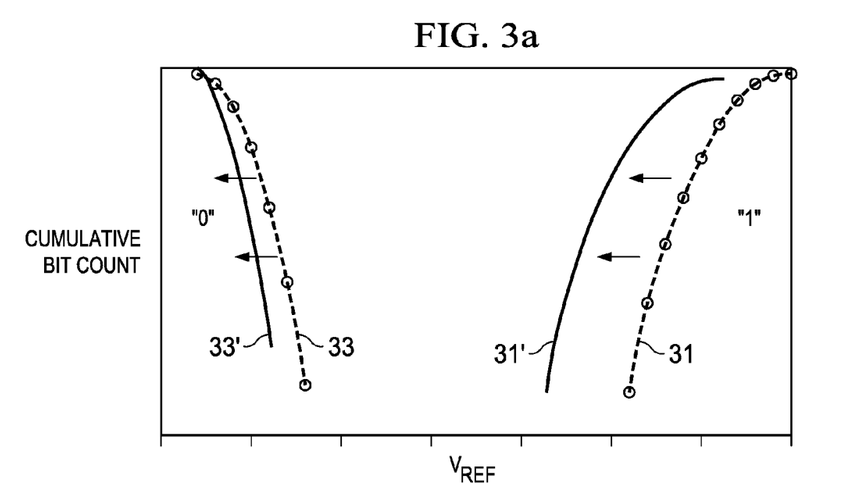
FIG. 3a illustrates plots of cumulative bit fail distribution for 1T-1C FRAM cells versus reference voltage level at the time of manufacture and also after an accelerated operating life test.

FIG. 3a illustrates the behavior of this mechanism of read margin degradation for an array of FRAM cells $2_{jk}$ as described above relative to FIGS. 2a through 2c, specifically for such an array in which no cells are "stuck" bits. The plots of FIG. 3a are in the form of plots of a cumulative failed bit count with varying levels (i.e., a "shmoo") of reference voltage $V_{REF}$ generated by reference voltage generator circuit 9 and applied to sense amplifier 8 of FIG. 2a in the read operation in which "after-pulse" sensing is used, for the "0" and "1" programmed data states and before and after a long term data retention bake. Specifically, plot 31 illustrates the cumulative number of bits in the array that are programmed to a "1" data state and, when read at time-zero (i.e., prior to a data retention bake), return an incorrect "0" data value over varying reference voltage levels $V_{REF}$. For this data state, of course, higher reference voltage $V_{REF}$ levels cause more bits to fail, with the weakest bit failing at the lowest reference voltage $V_{REF}$. Similarly, plot 33 illustrates cumulative failed bits for the same array for the "0" data state, prior to a data retention bake; for this data state, the weakest bit fails at the highest reference voltage $V_{REF}$ level.

Plots 31', 33' illustrate the change in cumulative failed "1" and "0" data state bits, respectively, for the same population of FRAM cells following a data retention bake of 1000 hours at 125° C. As known in the art, this data retention bake is an accelerated measurement of the expected data retention reliability of the FRAM over its operating life. As evident from the shift from plot 31 to plot 31' in FIG. 3a, this data retention bake resulted in the "1" data state cumulative fail bit count shifting to lower levels of reference voltage $V_{REF}$, indicating weakened data retention and reduced read margin for this data state. Conversely, plot 33' shows, relative to time-zero plot 33, that the cumulative failed count for the "0" data state also shifts to lower levels of reference voltage $V_{REF}$; however, this shift actually improves the read margin of 1T-1C cells for the "0" data state.

Figure 3B:
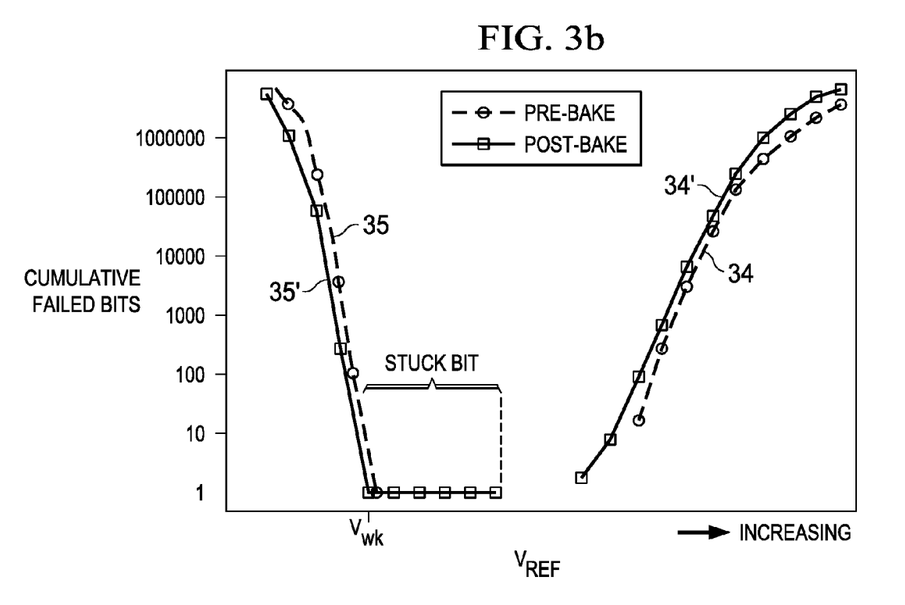
FIG. 3b illustrates plots of cumulative bit fail distribution versus reference voltage level for a population of FRAM cells including one stuck bit cell, at the time of manufacture and also after an accelerated operating life test.

FIG. 3b illustrates the read margin behavior versus reference voltage $V_{REF}$ for a similar array of FRAM cells as that of FIG. 3a, but in which one cell exhibits a "stuck" bit defect. For the high polarization capacitance data state (the "1" data state), plots 34, 34' illustrates the cumulative number of bits in the array that are programmed to a "1" data state and return an incorrect "0" data value over varying reference voltage levels $V_{REF}$, before and after a data retention bake of 1000 hours at 125° C., respectively. The left-ward shift from plot 34 to plot 34' shown in FIG. 3b for this data state illustrates the same weakened data retention and reduced read margin behavior as described above for the population of FIG. 3a.

For the low polarization capacitance data state (the "0" data state), however, the presence of a "stuck" bit in the characterized population is evident in the difference between pre-bake and post-bake plots 35, 35', respectively, in FIG. 3b. For all but one of the FRAM cells in this population, plots 35, 35' illustrate little, if any, left-ward shift for the "0" data state caused by the data retention bake. In this example, however, one FRAM cell fails at levels of reference voltage $V_{REF}$ that are significantly above the level $V_{wk}$ which would be predicted for the weakest "0" cell from extrapolation of plot 35' from its higher bit fail counts. As evident from FIG. 3b, this single cell (i.e., the cell constituting a cumulative failed bit count of "1") fails at each of several reference voltage $V_{REF}$ levels above the level $V_{wk}$. This cell is considered as a "stuck" bit, in that this cell returns a "1" data state when read at any reasonable reference voltage $V_{REF}$, even if programmed to a "0" level.

It has been observed, according to this invention, that stuck bit cells in an FRAM memory of the 1T-1C type exhibit a different behavior following a data retention bake than cells that are not stuck in this manner. With reference to FIG. 3b, FRAM cells programmed to the low polarization capacitance state (the "0" data state) become stronger "0" cells following the bake, in the sense that they return the programmed "0" data following the data retention bake at lower $V_{REF}$ levels than before the bake, as shown by the left-ward shift of plot 35' relative to plot 35 toward lower reference voltage $V_{REF}$ levels. It is contemplated that the reduced polarization of the ferroelectric material caused by the data retention bake is reflected as reduced "signal" applied by each cell $2_{jk}$ to its corresponding bit line $BL_k$ when read, particularly in the after-pulse sensing scheme. The left-ward shift of plot 34' relative to plot 34 illustrates the weaker signal for the "1" data state cells, which is also caused by the reduced polarization from the data retention bake. On the other hand, the stuck bit shown in FIG. 3b fails at a higher reference voltage $V_{REF}$ as a result of the data retention bake, which indicates more "signal" being presented by that cell $2_{jk}$ to its bit line $BL_k$ in the read operation than before the bake.

Figure 3C:
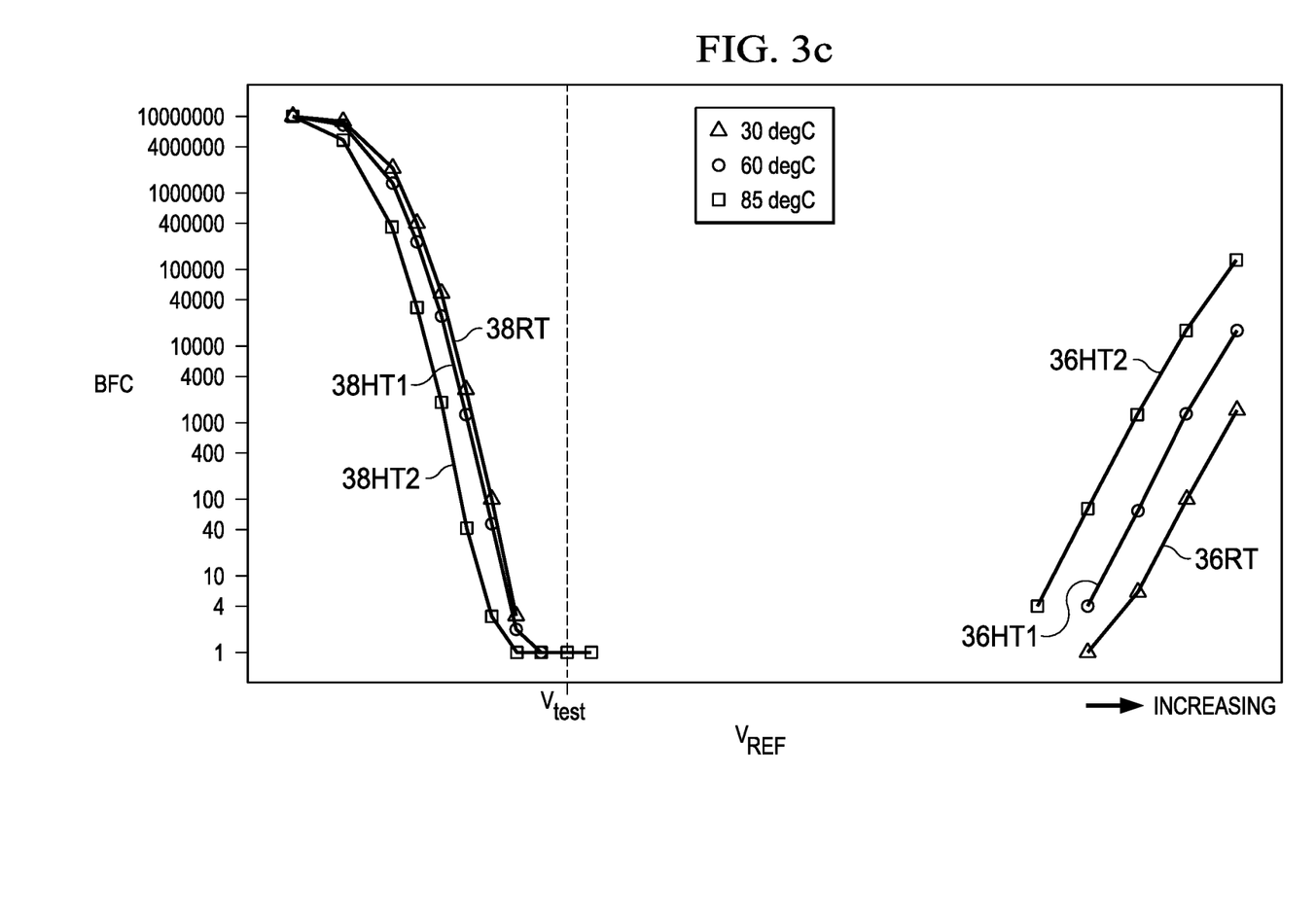
FIG. 3c illustrates plots of cumulative bit fail distribution versus reference voltage level for the population of 1T-1C FRAM cells shown in FIG. 3b, when tested at various temperatures.

It has also been observed, according to this invention, that higher operating temperatures tend to exacerbate the "sticking" of FRAM cells. FIG. 3c illustrates the shmoo results obtained at different test temperatures over varying reference voltage $V_{REF}$ for both data states, for this same population of 1T-1C cells after a data retention bake of 1000 hours at 125° C. Plots 36RT, 36HT1, 36HT2 illustrate the cumulative failed bit counts versus reference voltage $V_{REF}$ when read at 30° C., 60° C., and 85° C., respectively, for the "1" data state. As evident from FIG. 3c, the "1" data state cells become weaker (i.e., fail at lower reference voltage $V_{REF}$ at higher operating temperatures, as is typical for FRAM devices. Conversely, this population of cells $2_{jk}$ exhibit poorer "0" data state read performance (i.e., fail at a higher reference voltage $V_{REF}$) at cooler operating temperatures, as exhibited by 30° C. plot 38RT and 60° C. plot 38HT1 being shifted right-ward relative to plot 38HT2 obtained at 85° C.

The stuck bit in this population of cells $2_{jk}$ becomes evident in these shmoo results only at the higher temperatures, however. As evident from FIG. 3c, the presence of a stuck bit is not evident from plot 38RT, and is at best ambiguous in plot 38HT1. However, the stuck bit is very evident in plot 38HT2 obtained from the shmoo of the device at an operating temperature of 85° C. Again, this behavior of the stuck bit (i.e., failing at higher reference voltage $V_{REF}$) is opposite from the behavior of the other cells $2_{jk}$ in this population (i.e., failing at lower reference voltage $V_{REF}$). Indeed, it has been observed, in connection with this invention, that the specific stuck bit evident in plot 38HT2 is not necessarily the weakest bit in the $V_{REF}$ shmoo at 30° C.

From these observations, it is contemplated that the physical failure mechanism causing a stuck bit is a defect in the ferroelectric material that results in the ferroelectric capacitor leaking under bias, and that is exacerbated by exposure to the high temperature of the data retention bake, and that correspondingly is vulnerable to surfacing during the operating life of the FRAM device. This leaky ferroelectric capacitor causes the "signal" applied to bit line $BL_k$ by cell $2_{jk}$ (FIG. 2b) in the lower polarization capacitance state (the "0" data state) to be greater than if the capacitor were not leaky, in that charge from the pulse at plate line PL leaks through capacitor 6 to bit line $BL_k$ when accessed. Conversely, a loss of polarization from the data retention bake is reflected by a smaller "signal" from the accessed cell $2_{jk}$, allowing the "0" data state to be sensed at a lower reference voltage $V_{REF}$.

The behavior of these stuck bits following the accelerated stress of the high temperature bake as evident in the plots of FIG. 3b is consistent with such a leaky bit mechanism. For example, it is believed that the stuck bit identified in plot 35' is in fact somewhat leaky when initially tested at 30° C. (plot 35), but that this leakage is too small to be evident as distinct from the other cells. Indeed, it has been observed that the conventional time-zero measurement of the slope of a cumulative fail bit distribution versus reference voltage $V_{REF}$ of half-cells of 2T-2C FRAM cells, as mentioned above in connection with the Background of the Invention, did not identify or distinguish those ferroelectric capacitors that later become "stuck" following a bake or during its operating life. In addition, those skilled in the art will recognize that conventional 2T-2C FRAM cells with a leaky capacitor according to this mechanism will not necessarily cause a data read failure. This is because even a leaky capacitor (i.e., a half-cell stuck in the "1" state) will be paired with a complementary capacitor that is programmed to the full "1" data state, such that the differential signal applied by the cell to its bit line pair will still indicate the correct data state. Referring again to the 1T-1C FRAM cell case, it is believed that the subjecting of these leaky cells to a high temperature bake further damages the ferroelectric capacitors in these leaky cells, resulting in additional charge leakage when later read. As mentioned above, it has been observed that the weakest bits prior to high temperature bake are not necessarily those bits that become stuck bits following the bake.

The capacitor leakage from this mechanism would be expected to increase at higher operating temperature, and indeed the plots of FIG. 3c show that this is the case for FRAM stuck bits. In addition, it has been observed that the dielectric constant of PZT ferroelectric material, as used in the FRAM cells for which the plots of FIG. 3c were obtained, decreases with temperature. FIG. 3c shows this effect by the fail bit distribution curve for the population of healthy FRAM cells shifting to the left (toward lower reference voltage $V_{REF}$) at increased temperature. Because the higher temperature increases leakage of the damaged cells, it has been observed, according to this invention, that testing at a high temperature such as 85° C. helps to distinguish the damaged stuck bit cells from the healthy cells. This separation of stuck FRAM cells from healthy FRAM cells is used to advantage in connection with these embodiments.

According to these embodiments, a method of screening FRAM memory devices to identify potential stuck bits at the time of manufacture is provided. Proper identification of those vulnerable cells allows the "repair" (i.e., replacement) of those cells by redundant FRAM cells, or failing the FRAM device as a whole if too many stuck bits appear. This screening method will now be described in detail with reference to FIG. 4.

Figure 4:
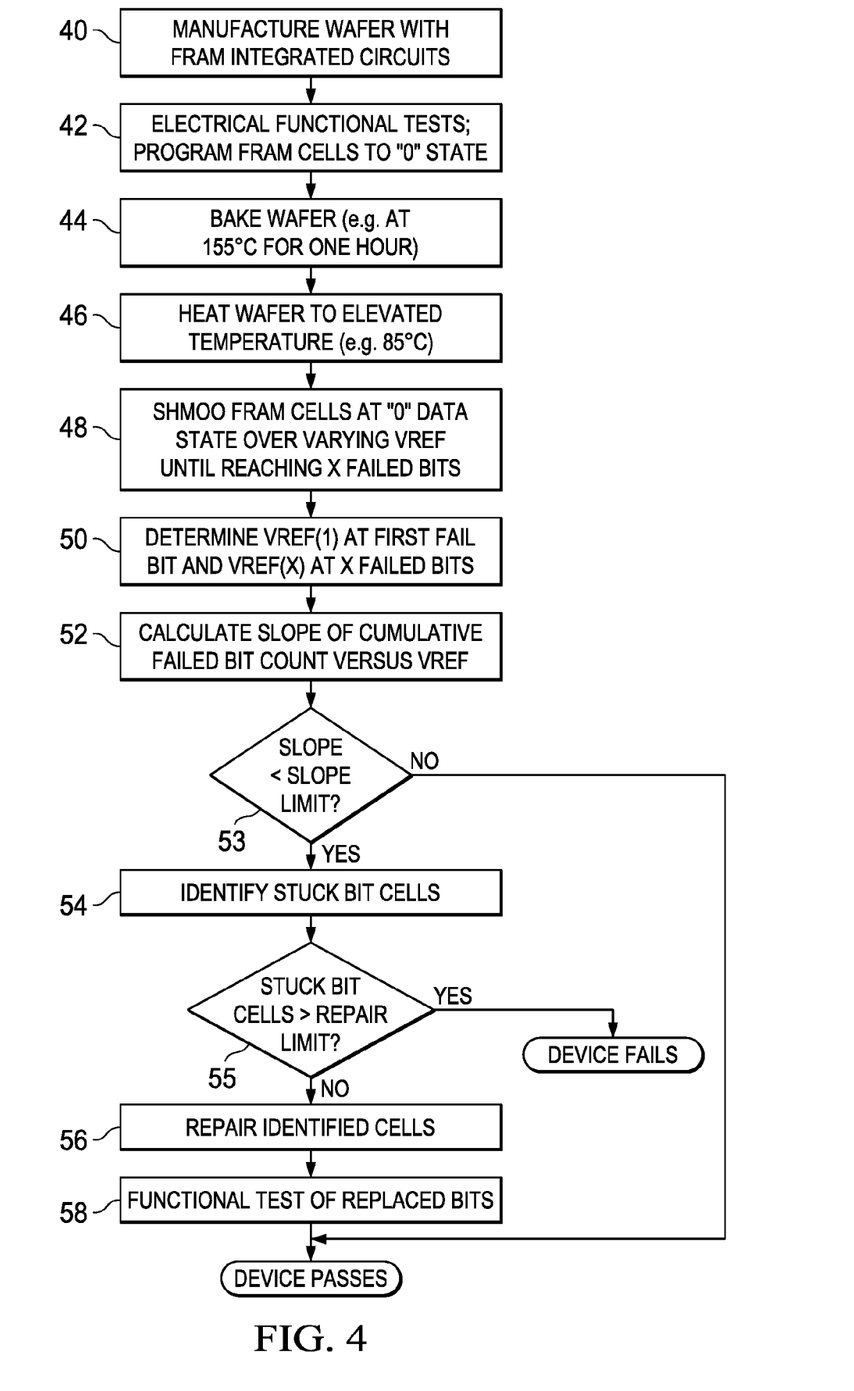
FIG. 4 is a flow diagram of a method of screening integrated circuits including FRAM arrays for stuck bits, according to an embodiment.

Referring now to FIG. 4, a method of performing a reliability screen for integrated circuits including FRAM cells, such as 1T-1C cells $2_{jk}$ described above, to identify those cells vulnerable to becoming stuck bits during their operating life, will now be described in connection with an embodiment. According to this embodiment, this reliability screen is performed at a point in manufacture commonly referred to as "multiprobe" electrical testing of the integrated circuits in wafer form, as may be carried out using conventional electrical test equipment implemented at one or more conventional multiprobe test stations. As such, the reliability screen according to this embodiment follows process 40 in FIG. 4, in which integrated circuits including ferroelectric memory cells, arranged in a memory array, are formed at the surface of a semiconductor wafer in the conventional manner. It is contemplated that the particular arrangements and implementations of FRAM cells in the devices manufactured in process 40 may vary widely, for example as one or more FRAM memory arrays within a larger scale integrated circuit such as a microprocessor or microcontroller, or realized as a stand-alone FRAM memory integrated circuit. In addition, it is to be understood that the reliability screen of these embodiments may alternatively be performed, in whole or in part, on individual integrated circuits that are no longer in wafer form, whether packaged or not. However, it is contemplated that it will typically be advantageous to perform this screen on devices in wafer form to avoid the cost of packaging and otherwise processing devices that will not be suitable for end use.

The following description of the reliability screen according to this embodiment will be described with reference to a single integrated circuit (i.e., "die" on the wafer), for clarity of the description. As those skilled in the art having reference to this specification will readily recognize, it is of course contemplated that each die on the wafer manufactured in process 40 will be tested in the same manner, from process to process in this test flow, in the usual manner for electrical testing of circuits in wafer form. In addition, it is contemplated that the reliability screen of this embodiment, and of the other embodiments described in this specification, may be carried out using conventional electrical test equipment implemented at one or more conventional multiprobe test stations.

In process 42, electrical functional and parametric testing of the integrated circuits on the wafer is performed using conventional electrical test equipment implemented at one or more conventional multiprobe test stations. The particular tests performed as part of this process 42 that are directed to FRAM cells are contemplated to include typical functionality tests (write and read of both data states to all cells), tests of pattern sensitivity, address decoder functionality (e.g., the well-known "march" test), and performance tests such as evaluating read access times. In this embodiment, it is contemplated that functional test process 42 will be performed at room temperature (i.e., ≤30° C.).

As part of functional test process 42, the FRAM cells of each die on the wafer are programmed to have a "0" state at the completion of functional test process 42, as typically done for 1T-1C FRAM cells prior to a high temperature process (e.g., packaging). The "0" state programmed into the FRAM cells in process 42 according to this embodiment corresponds to the "+1" polarization state described above for capacitor 6 of cell $2_{jk}$, which is the polarization state that exhibits a lower polarization capacitance in a read operation. This "0" data state thus corresponds to the C(+1) state in the hysteresis diagram of FIG. 1a, when read by the application of a positive voltage across capacitor 6. However, it is contemplated that the particular data state programmed into FRAM cells $2_{jk}$ of the FRAM under test in this process 42 need not necessarily be the "0" data state.

Following functional test process 42, the wafer including the programmed FRAM cells is subjected to a high temperature bake in process 44. As discussed above relative to FIG. 3b, a high temperature bake of FRAM cells has the effect of accelerating stuck bit failures. It has been observed, in connection with this invention, that the temperature of bake process 44 must be relatively high in order to result in the desired effect. According to this embodiment, for FRAM cells constructed according to a current-day technology in which the ferroelectric material is PZT, bake process 44 is performed at a temperature of at least 125° C., for a duration of at least about one hour. An example of the conditions for bake in process 44 is one hour at about 150° C.

Following bake process 44, additional multiprobe test operations are performed at an elevated temperature for each of the integrated circuits on the wafer, according to this embodiment. As such, in process 46, the wafer is heated to an elevated temperature, for example a temperature from at least about 60° C. to about 125° C. (i.e., the upper end of the operating temperature range of the FRAM), by placing the wafer on a heated multiprobe chuck at the multiprobe test station. In one implementation of this embodiment, the elevated temperature to which the wafer is heated in process 46 is about 85° C.

The following test operations will now be described as performed for a single integrated circuit die on the wafer. Of course, these operations will be repeated for each die on that same wafer (skipping any that were marked as failed in functional test process 42) while the wafer remains on the heated chuck, and thus at the elevated temperature applied in process 46.

In process 48, the automated test equipment is operated so as to "shmoo" reference voltage $V_{REF}$ as a population of FRAM cells $2_{jk}$ in the integrated circuit is read, in order to identify at least a portion of the cumulative fail bit count distribution of programmed "0" cells with respect to reference voltage $V_{REF}$. Specifically, the portion of this cumulative fail bit count distribution to be identified in process 48 is the "tail" of the distribution, from the reference voltage $V_{REF}$ at which the first (i.e., weakest) cell fails to return the programmed "0" level to a level at which a selected number of cells fail the read of the "0" data state. Preferably the population tested in process 44 includes all of the 1T-1C FRAM cells $2_{jk}$ in the integrated circuit so that all stuck bits can be detected, and also to maximize the accuracy of the identified cumulative fail bit count distribution.

The test of process 48 may first verify whether all FRAM cells $2_{jk}$ retained the "0" data state level programmed in process 42, by performing a read at a nominal level of reference voltage $V_{REF}$, identifying those cells $2_{jk}$ exhibiting a gross data retention failure. Either as a result of this verification, or by an additional programming step, each of FRAM cells $2_{jk}$ in the test population is programmed to the "0" data state in advance of the first shmoo read.

As known in the art, a "shmoo" refers to a test operation that is repetitively performed at multiple values of one or more electrical parameters. In this embodiment as applied to the arrangement of FIG. 2b, the parameter that is varied in shmoo process 48 is reference voltage $V_{REF}$ as generated by a $V_{REF}$ generator circuit 9 and applied to sense amplifiers 8, with all of the FRAM cells $2_{jk}$ in the test population being read at each reference voltage level. The manner in which reference voltage $V_{REF}$ is incrementally varied from one iteration to the next will of course depend on the construction and operation of $V_{REF}$ generator circuit 9. One type of $V_{REF}$ generator circuits known in the art includes a bank of ferroelectric capacitors, for which reference voltage $V_{REF}$ is varied by selectively switching in (or out, as the case may be) one or more additional capacitors in each iteration to modulate the reference voltage $V_{REF}$ output by the circuit. Other types of $V_{REF}$ generator circuits are known in the art, and may alternatively be used in the device under test.

According to this embodiment, shmoo process 48 is performed by the automated test equipment varying reference voltage $V_{REF}$ incrementally lower from a high level at which all cells return a "0" level until a selected number X of FRAM cells $2_{jk}$ in the test population fails the read. In so doing, the level of reference voltage $V_{REF}$ at which the first bit to fail the "0" data state read is stored by the automated test equipment in its memory or is otherwise retained, and the shmoo continues at decreasing $V_{REF}$ levels until the level at which the selected number X of bits fail. This number X of failed bits should be high enough that an accurate slope of the failed bit count distribution with reference voltage $V_{REF}$ can be determined, and as such this number X may vary as appropriate for the particular memory size and stuck bit propensity. In one embodiment, the fail bit number X is selected to be greater than about ten times than the expected highest number of stuck bits. For the example of a memory size and type for which as many as twenty stuck bits have been observed, a suitable fail bit number X according to this embodiment would be at least about 300 bits. In one implementation for that memory configuration, the selected number X of failed bits for which the shmoo of process 48 is performed is set at 500 bits. In process 50, the automated test equipment determines the reference voltage $V_{REF}(1)$ at which the weakest bit first failed to return the "0" data state when read, and the reference voltage $V_{REF}(k)$ at which the number X of bits failed to return the "0" data state when read.

Figure 5:
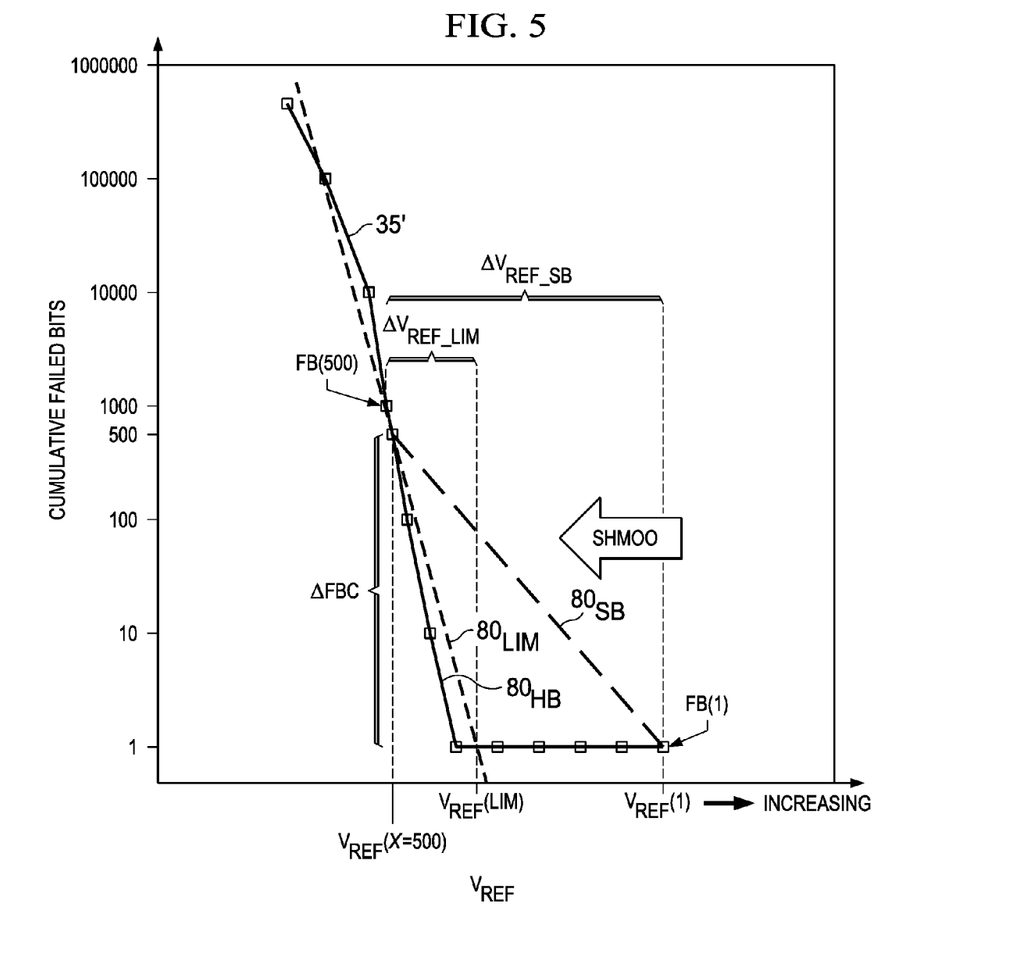
FIG. 5 is a plot of cumulative bit fail distribution versus reference voltage level illustrating the operation of the screening method of FIG. 4.

FIG. 5 illustrates the operation of shmoo process 48 for an example of a population of FRAM cells $2_{jk}$, specifically that corresponding to plot 35' of FIG. 3b. As suggested by FIG. 5, shmoo process 48 is performed by iteratively decreasing reference voltage $V_{REF}$ from some nominal or higher level (not shown), and then iteratively reading the population of cells at decreasing levels of reference voltage $V_{REF}$. As known in the art, the read of a 1T-1C FRAM cell is a destructive read, requiring the re-programming of each cell after its sensing. FIG. 5 illustrates the reference voltage $V_{REF}(1)$ at which the weakest bit failed and the reference voltage $V_{REF}(X=500)$ at which the cumulative failed bit count reaches the selected number X of 500 bits, as determined in process 50 from the results of shmoo process 48.

According to this embodiment, the slope of a line between reference voltage $V_{REF}(1)$ at which the weakest bit failed and the reference voltage $V_{REF}(X)$ at which the selected number X bits failed, in the log(cumulative fail bit count)–$V_{REF}$ plane, is determined by the automated test equipment in process 52. In the example of FIG. 5, line $80_{SB}$ is an example of this line for an FRAM device that has a stuck bit; as evident from that example, line $80_{SB}$ corresponds to a straight line between point FB(1) corresponding to the log of a cumulative fail bit count of 1 and the highest reference voltage level $V_{REF}(1)$ at which that bit failed, and point FB(500) corresponding to the log of a cumulative fail bit count of 500 and the reference voltage level $V_{REF}(X=500)$ at which that cumulative fail bit count is reached. The slope of this line, in the semi-log plane, corresponds to the absolute value of the ratio of difference ΔFBC between bit counts 1 and X=500 (i.e., the difference [log(X=500)–log(1)]) to the difference $\Delta V_{REF\_SB}$ between reference voltages $V_{REF}(X=500)$ and $V_{REF}(1)$.

Decision 53 is then executed by the automated test equipment to determine whether the slope determined in process 52 is flatter (i.e., lower in magnitude) than a predetermined slope limit corresponding to a typical FRAM population with no stuck bits. The example of FIG. 5 is illustrative in this regard. Line $80_{HB}$ shown in FIG. 5 for this FRAM population corresponds to the failed bit count distribution if no stuck bit were present, i.e., if the first bit to fail did not also fail at higher $V_{REF}$ levels. It is apparent from FIG. 5 that the slope of this line $80_{HB}$ for a healthy FRAM cell population is much steeper than is the slope of line $80_{SB}$ in which a stuck bit is present in the population. Accordingly, decision 53 determines whether the slope determined in process 52 for the FRAM device under test has a flat slope, similar to line $80_{SB}$, indicating a stuck bit, or a steep slope, similar to line $80_{HB}$, indicating that all bits are healthy.

According to this embodiment, the comparison of decision 53 is made relative to a predetermined slope limit that is slightly flatter than observed healthy populations, to avoid undue yield loss. For the example of FIG. 5, the slope limit applied in decision 53 may correspond to the slope of line $80_{HB}$, which is slightly flatter than line $80_{HB}$ for the healthy population. It is contemplated that this slope limit will typically be derived in advance, for example by way of characterization of the fail bit distributions versus reference voltage level for FRAM devices before and after operating life tests, data retention bakes, and the like.

According to this embodiment, slope determination process 52 and decision 53 may be facilitated by applying a constant difference ΔFBC between bit counts 1 and X (i.e., a constant difference [log(X=500)–log(1)]). Based on that recognition, process 52 may be performed simply by determining the difference between the reference voltage $V_{REF}(1)$ at which the first bit fails and reference voltage $V_{REF}(X)$ at which the fail bit count reaches the preselected number X. In the example of FIG. 5, difference $\Delta V_{REF\_SB}$ is the difference between reference voltages $V_{REF}(1)$ and $V_{REF}(X=500)$, while difference $\Delta V_{REF\_LIM}$ is the difference in reference voltage $V_{REF}$ corresponding to the slope limit of line $80_{LM}$. Assuming a constant difference ΔFBC, decision 53 may be performed simply by determining whether $\Delta V_{REF\_SB}$ is greater than difference $\Delta V_{REF\_LIM}$, which it is in the case of plot 35' because of the presence of a stuck bit in the tested population. Conversely, a healthy population with a failed bit distribution following plot 35' but without the stuck bit would exhibit a difference between reference voltages $V_{REF}(1)$ and $V_{REF}(X=500)$ less than the difference $\Delta V_{REF\_LIM}$ in decision 53, indicating that no stuck bit is present.

It should be noted that the absolute reference voltage $V_{REF}$ of the various fail bit counts is not relevant to detecting stuck bits according to this embodiment of the invention. Some populations of FRAM cells may have poorer read margin for the "0" data state (i.e., a fail bit count distribution shifted to the right, at higher $V_{REF}$ levels), but without any stuck bits; those populations would exhibit a slope steeper than the slope limit, regardless of the absolute reference voltages considered. Conversely, some populations may have better read margin for its healthy bits but also have one or more stuck bits; these populations would exhibit a flatter slope than the slope limit, regardless of the absolute reference voltages considered.

Referring back to FIG. 4, the result of decision 53 determines the further processing of the integrated circuit device including the FRAM cells tested according to this method. If decision 53 determines that no stuck bits are present, as a result of the slope of the fail bit distribution being at or steeper than the slope limit (decision 53 is "no"), the device is considered as passing this stuck bit screen. Further testing or other manufacturing operations may then be performed as desired.

If decision 53 determines that the device includes one or more stuck bits of FRAM cells because of the slope of the fail bit distribution being flatter than slope limit (decision 53 is "yes"), the automated test equipment identifies those FRAM cells that exhibit the failing $V_{REF}$ levels causing the flatter slope detected in decision 53. For example, process 54 may be performed by identifying address locations of those FRAM cells that fail at a $V_{REF}$ level to the right of (i.e., higher than) the line defined by the slope limit (e.g., line $80_{LIM}$ in FIG. 5), or by otherwise identifying those cells deviating from a semi-log straight line defined by the higher fail bit counts in the log(cumulative fail bit count) vs. $V_{REF}$ plane. In decision 55, the number of identified stuck bit FRAM cells from process 54 is compared with a limit of cells that can be "repaired" (more accurately, "replaced") by way of redundancy; depending on the redundancy architecture of the memory, comparison of the relative address locations of the stuck bit cells may also be evaluated relative to certain limits (e.g., limit of cells in a given row that may be replaced) in decision 55. If decision 55 indicates that the number of stuck bits is at or below the repair limit (decision 55 returns a "no" result), repair is carried out by way of process 56. In process 58, additional testing of the now-enabled redundant cells is applied as desired, and if such testing is successful, the device is considered to have passed. However, if the number or address locations of the stuck bit cells identified in process 54 preclude repair by way of redundancy (decision 55 returns a "yes" result), the device is considered to have failed this stuck bit reliability screen altogether.

In any case, upon completion of the stuck bit screen and other functional testing at the elevated temperature of process 44 for this specific die, the test equipment advances to a next die on the wafer, and carries out the stuck bit screen for a next device in a similar manner as described above, beginning with process 48. This die-by-die testing continues in this manner until all devices on the wafer have been screened, following which the manufacture of the integrated circuits continues in the conventional manner, as appropriate for the desired end product.

According to the embodiments described above, a time-zero screen for ferroelectric devices is provided to identify, and remove or repair, those devices that are vulnerable to stuck bit failures over their expected operating life. In particular, these embodiment enable the ferroelectric memories to be accurately evaluated for this failure mechanism at the time of manufacture. It is believed that the reliability screen of these embodiments will minimize the occurrence of both "false negatives" (i.e., devices that pass the screen but are in fact vulnerable to becoming stuck bits) and "false positives" (i.e., devices that fail the screen but are not in fact vulnerable to this mechanism), as compared with conventional reliability screens and especially as compared with sampled testing. As a result, the overall reliability of the entire population of ferroelectric integrated circuits manufactured and installed into system applications is improved by these embodiments. It is contemplated that this improvement in data retention reliability for FRAM memories can facilitate the use of 1T-1C FRAM cells for applications that previously required 2T-2C to ensure acceptable reliability, thus providing significantly increased memory density and capacity and reduced cost for non-volatile memory in those systems.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing an integrated circuit including memory cells of the ferroelectric one transistor-one capacitor (1T-1C) type, comprising the steps of:
    baking the integrated circuit at a first elevated temperature for a selected duration;
    then, at a second elevated temperature lower than the first elevated temperature, reading each of a plurality of the memory cells programmed to a first data state corresponding to a lower polarization capacitance, at each of a plurality of reference voltages, to determine a first reference voltage at which a first one of the plurality of memory cells fails to return the first data state when read, and a second reference voltage at which a selected number of the plurality of memory cells fails to return the first data state when read; and
    comparing a slope of a line in the failed bit count versus reference voltage plane indicated by the first and second reference voltages with a slope limit to determine whether one or more of the plurality of memory cells constitute stuck bits.

2. The method of claim 1, further comprising:
    before the baking step, programming a plurality of the ferroelectric memory cells to the first data state.

3. The method of claim 1, further comprising:
    responsive to the comparing step determining that the slope is flatter than the slope limit, identifying one or more of the cells as stuck bit cells.

4. The method of claim 3, further comprising:
    replacing one or more of the stuck bit cells with redundant cells.

5. The method of claim 1, wherein the comparing step comprises:
    comparing a difference between the first and second reference voltages to a reference voltage difference limit corresponding to the slope limit.

6. The method of claim 1, wherein the first elevated temperature is at least about 125° C.;
    wherein the first selected duration is at least about one hour.

7. The method of claim 6, wherein the first elevated temperature is at least about 150° C.

8. The method of claim 6, wherein the second elevated temperature is at least about 60° C.

9. The method of claim 6, wherein the second elevated temperature is about 85° C.

10. The method of claim 1, wherein the first elevated temperature is at least about 60° C.

11. The method of claim 1, wherein the second elevated temperature is about 85° C.

12. The method of claim 1, wherein each memory cell comprises a ferroelectric capacitor having first and second plates, and a pass transistor coupled between the first plate of the ferroelectric capacitor and a bit line corresponding to the memory cell;
   wherein the step of reading each of the plurality of memory cells at one of the plurality of reference voltages comprises, for each memory cell:
      coupling the first plate of the ferroelectric capacitor to the bit line; and
      comparing a voltage at the bit line with the reference voltage.

13. The method of claim 12, wherein the first data state corresponds to polarization of the ferroelectric capacitor to a first polarization state in which the capacitor retains a voltage of a first polarity in the absence of applied voltages;
   and wherein the reading step further comprises:
      biasing the second plate of the ferroelectric capacitor to a voltage, relative to the bit line, of a second polarity opposite to the first polarity.

14. The method of claim 1, wherein the integrated circuit is one of a plurality of similar integrated circuits formed in a single integrated circuit wafer;
   wherein the baking, reading, and comparing steps are performed with the integrated circuit in wafer form;
   wherein the integrated circuits are heated to the second elevated temperature by placing the wafer on a heated chuck during the reading steps.

15. A method of testing a plurality of integrated circuits formed in a single integrated circuit wafer, each of the plurality of integrated circuits including ferroelectric memory cells, the method comprising the steps of:
   baking the wafer at a first elevated temperature for a first selected duration;
   then heating the wafer to a second elevated temperature lower than the first elevated temperature; and
   then performing a multiprobe test on the wafer at the second elevated temperature, for each of the plurality of integrated circuits, the multiprobe test comprising:
      reading each of a plurality of the memory cells programmed to a first data state corresponding to a lower polarization capacitance, at each of a plurality of reference voltages, to determine a first reference voltage at which a first one of the plurality of memory cells fails to return the first data state when read, and a second reference voltage at which a selected number of the plurality of memory cells fails to return the first data state when read; and
      comparing a slope of a line in the failed bit count versus reference voltage plane indicated by the first and second reference voltages with a slope limit to determine whether one or more of the plurality of memory cells in the integrated circuit constitute stuck bits.

16. The method of claim 15, further comprising, for each of the plurality of integrated circuits:
   responsive to the comparing step determining that the slope is flatter than the slope limit, identifying one or more of the cells as stuck bit cells.

17. The method of claim 16, further comprising, for each of the plurality of integrated circuits:
   comparing a number of the stuck bit cells with a repair limit;
   responsive to the comparing step determining that the number of stuck bit cells is at or below the repair limit, replacing the stuck bit cells with redundant cells.

18. The method of claim 15, wherein the heating step comprises:
   placing the wafer on a heated chuck during the reading steps.

19. The method of claim 15, wherein the first elevated temperature is at least about 125° C.;
   wherein the first selected duration is at least about one hour;
   and wherein the second elevated temperature is at least about 60° C.

20. The method of claim 15, wherein each memory cell comprises a ferroelectric capacitor having first and second plates, and a pass transistor coupled between the first plate of the ferroelectric capacitor and a bit line corresponding to the memory cell;
   wherein the step of reading each of the plurality of memory cells at one of the plurality of reference voltages comprises, for each memory cell:
      coupling the first plate of a ferroelectric capacitor in the memory cell to the bit line; and
      comparing a voltage at the bit line with the reference voltage;
   wherein the first data state corresponds to polarization of the ferroelectric capacitor to a first polarization state in which the capacitor retains a voltage of a first polarity in the absence of applied voltages;
   and wherein the reading step further comprises:
      biasing the second plate of the ferroelectric capacitor to a voltage, relative to the bit line, of a second polarity opposite to the first polarity.

\* \* \* \* \*